United States Patent
Ando

(10) Patent No.: US 9,627,574 B2
(45) Date of Patent: Apr. 18, 2017

(54) METHOD OF MANUFACTURING A PHOTOVOLTAIC DEVICE

(71) Applicant: Konica Minolta Laboratory U.S.A., Inc., San Mateo, CA (US)

(72) Inventor: Hiroaki Ando, Foster City, CA (US)

(73) Assignee: Konica Minolta Laboratory U.S.A., Inc., San Mateo, CA (US)

( * ) Notice: Subject to any disclaimer, the term of this patent is extended or adjusted under 35 U.S.C. 154(b) by 337 days.

(21) Appl. No.: 14/355,160

(22) PCT Filed: Nov. 29, 2012

(86) PCT No.: PCT/US2012/067068
§ 371 (c)(1),
(2) Date: Apr. 29, 2014

(87) PCT Pub. No.: WO2013/082287
PCT Pub. Date: Jun. 6, 2013

(65) Prior Publication Data
US 2014/0304987 A1 Oct. 16, 2014

Related U.S. Application Data

(60) Provisional application No. 61/565,399, filed on Nov. 30, 2011.

(51) Int. Cl.
*H01L 31/18* (2006.01)
*H01L 31/0296* (2006.01)
(Continued)

(52) U.S. Cl.
CPC .......... *H01L 31/18* (2013.01); *H01L 31/0296* (2013.01); *H01L 31/0322* (2013.01);
(Continued)

(58) Field of Classification Search
CPC . H01L 31/18; H01L 31/1828; H01L 31/1884; H01L 31/0296; H01L 31/0322;
(Continued)

(56) References Cited

U.S. PATENT DOCUMENTS 6,054,260 A 4/2000 Adin et al.
6,190,848 B1 2/2001 Boff et al.
(Continued)

FOREIGN PATENT DOCUMENTS

WO 2010110461 A1 9/2010
WO 2010138636 A2 12/2010
(Continued)

OTHER PUBLICATIONS

Zhao-Hui Li et al.; "Molybdenum thin film deposited by in-line DC magnetron sputtering as a back contact for Cu(In,Ga) Se2 solar cells"; Applied Surface Science, 257, pp. 9682-9688; 2011 (7 pages).
(Continued)

*Primary Examiner* — Carl Arbes
(74) *Attorney, Agent, or Firm* — Osha Liang LLP

(57) ABSTRACT

A photovoltaic device and a method of making a photovoltaic device that includes a stack of layers, including a substrate and an electrode layer. The photovoltaic device includes a semiconductor light absorption layer that is formed on the stack by a coating liquid that includes a plurality of semiconducting particles. The coating liquid may also include a solvent and a plurality of additive molecules. The photovoltaic device also includes a transparent conducting layer disposed on the semiconductor light absorption layer and a grid electrode disposed on the transparent conducting layer.

10 Claims, 6 Drawing Sheets

(51) Int. Cl.
*H01L 31/032* (2006.01)
*H01L 31/0749* (2012.01)

(52) U.S. Cl.
CPC ...... *H01L 31/0326* (2013.01); *H01L 31/0749* (2013.01); *H01L 31/1864* (2013.01); *Y02E 10/541* (2013.01); *Y02P 70/521* (2015.11); *Y10T 29/49126* (2015.01)

(58) Field of Classification Search
CPC ............. H01L 31/0326; H01L 31/0749; H01L 31/1864; Y02E 10/541
See application file for complete search history.

(56) References Cited

U.S. PATENT DOCUMENTS

| | | | |
|---|---|---|---|
| 6,682,990 | B1 | 1/2004 | Iwane et al. |
| 7,663,057 | B2* | 2/2010 | Yu .......................... B82Y 10/00 106/286.2 |
| 2004/0194821 | A1 | 10/2004 | Chittibabu et al. |
| 2004/0219730 | A1* | 11/2004 | Basol ........................ C23C 8/02 438/200 |
| 2005/0072461 | A1 | 4/2005 | Kuchinski et al. |
| 2005/0121068 | A1* | 6/2005 | Sager .................. H01L 51/4213 136/252 |
| 2005/0183767 | A1* | 8/2005 | Yu .......................... B82Y 10/00 136/263 |
| 2006/0207444 | A1* | 9/2006 | Schneider .............. B26D 7/015 99/537 |
| 2007/0163637 | A1* | 7/2007 | Robinson ............. B22F 1/0055 136/262 |
| 2007/0163638 | A1* | 7/2007 | Van Duren ........... B22F 1/0055 136/262 |
| 2007/0163639 | A1* | 7/2007 | Robinson ............. B22F 1/0055 136/262 |
| 2007/0163642 | A1* | 7/2007 | Van Duren ......... C23C 18/1229 136/262 |
| 2007/0169809 | A1* | 7/2007 | Van Duren ........... B22F 1/0055 136/262 |
| 2007/0169811 | A1* | 7/2007 | Van Duren ........... B22F 1/0055 136/262 |
| 2007/0169812 | A1* | 7/2007 | Robinson ............ C23C 18/1204 136/262 |
| 2007/0169813 | A1* | 7/2007 | Robinson ............ C23C 18/1204 136/262 |
| 2007/0178241 | A1 | 8/2007 | Martinotto et al. |
| 2007/0178620 | A1* | 8/2007 | Basol .................. H01L 31/0322 438/94 |
| 2007/0241670 | A1 | 10/2007 | Sapochak et al. |
| 2008/0124831 | A1* | 5/2008 | Robinson ............ C23C 18/1229 438/84 |
| 2008/0311390 | A1 | 12/2008 | Seal et al. |
| 2009/0152115 | A1 | 6/2009 | Zaban et al. |
| 2010/0197068 | A1* | 8/2010 | Poon ............... H01L 31/022466 438/63 |
| 2010/0200941 | A1 | 8/2010 | Fujikata et al. |
| 2010/0300529 | A1 | 12/2010 | Kawahara et al. |
| 2011/0056564 | A1 | 3/2011 | Korgel et al. |
| 2011/0217544 | A1 | 9/2011 | Young et al. |

FOREIGN PATENT DOCUMENTS

| | | |
|---|---|---|
| WO | 2011065994 A2 | 6/2011 |
| WO | 2011066205 A1 | 6/2011 |

OTHER PUBLICATIONS

Extended Search Report issued in corresponding European Application No. 12853216.5, mailed Nov. 27, 2015 (16 pages).
International Search Report issued in PCT/US2012/067068 mailed on Feb. 6, 2013 (1 page).
Written Opinion of the International Searching Authority issued in PCT/US2012/067068 mailed on Feb. 6, 2013 (9 pages).
Office Action issued in corresponding Chinese Application No. 201280057932.9, mailed Aug. 6, 2015 (18 pages).
Partial Supplementary Search Report issued in corresponding European Application No. 12853216.5, mailed Jul. 24, 2015 (6 pages).
Qijie Guo et al.; "Synthesis of $Cu_2ZnSnS_4$ Nanocrystal Ink and its Use for Solar Cells"; J. Am. Chem. Soc., 131, XP-002566027, pp. 11672-11673; Jul. 31, 2009 (2 pages).
Office Action in corresponding Chinese Patent Application No. 201280057932.9 dated Apr. 15, 2016, with translation (7 pages).

* cited by examiner

METHOD OF MANUFACTURING A PHOTOVOLTAIC DEVICE

CROSS-REFERENCE TO RELATED APPLICATIONS

This application is a national phase application of PCT International Patent Application No. PCT/US2012/67068, filed on Nov. 29, 2012. PCT International Patent Application No. PCT/US2012/067068 claims priority to U.S. Provisional Application No. 61/565,399, filed on Nov. 30, 2011.

BACKGROUND

Many types of photovoltaic (PV) devices are currently being developed. Cadmium telluride (CdTe) and copper indium gallium selenide (CIGS) are types of compound semiconductors that are currently being studied due to the potential high power conversion efficiency (PCE) and low manufacturing cost. Recently, a similar type of PV device, cadmium zinc telluride (CZT), has been discovered and is becoming known for its potential safety and the availability of its materials. However, some of these PV devices require a vacuum process that is not preferable because of low process speeds and expensive equipment necessary for manufacturing.

Currently, the manufacturing of Copper Zinc Tin Selinium/Sulfide (CZTS) based PV devices with a high PCE are known to require dangerous and poisonous materials. Elimination of dangerous and poisonous materials is a key issues in the development of CZTS. Also, current techniques require high temperature and/or vacuum bases processes, contributing to the high cost. For the low cost production of PV devices, liquid coating methods or chemical bath deposition processes are desired.

SUMMARY OF INVENTION

In general, in one aspect, the invention relates to a photovoltaic device. The photovoltaic device includes a stack of layers which includes both a substrate and an electrode layer. The photovoltaic device includes a semiconductor light absorption layer (SLAL) formed by a plurality of semiconducting particles on the stack of layer. The SLAL is formed by a coating liquid. The photovoltaic device includes a transparent conducting layer disposed on the SLAL and a grid electrode disposed on the transparent conducting layer.

In general, in one aspect, the invention relates to a method of manufacturing a photovoltaic device. The method includes obtaining a stack of layers which includes a substrate and an electrode layer. The method also includes depositing, on the stack, a solvent, a plurality of semiconducting particles, and a plurality of additive molecules. The method includes evaporating the solvent from the stack by applying heat and sintering the stack to form the SLAL. The method further includes depositing a transparent electrode on the SLAL and a grid electrode of a conducting material on the transparent electrode.

Other aspects of the invention will be apparent from the following description and the appended claims.

DETAILED DESCRIPTION

Figure 1:
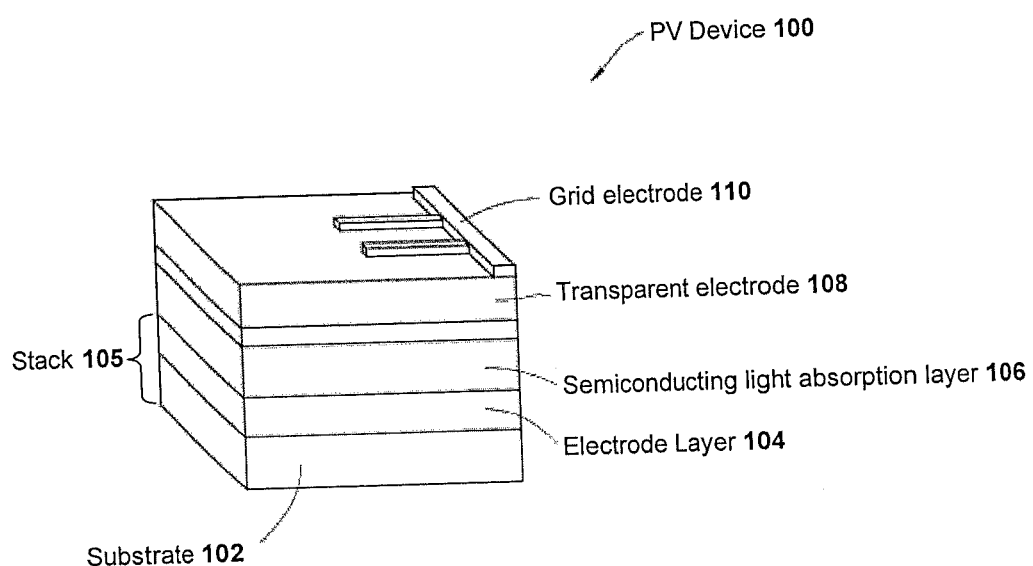
FIG. 1 shows a PV device in accordance with one or more embodiments of the invention.

Specific embodiments of the invention will now be described in detail with reference to the accompanying figures. Like elements in the various figures are denoted by like reference numerals for consistency.

In the following detailed description of embodiments of the invention, numerous specific details are set forth in order to provide a more thorough understanding of the invention. However, it will be apparent to one of ordinary skill in the art that the invention may be practiced without these specific details. In other instances, well-known features have not been described in detail to avoid unnecessarily complicating the description.

In general, embodiments of the invention are directed towards photovoltaic devices and the manufacture of photovoltaic devices having semiconductor light absorption layers. Additionally, embodiments of the invention are directed towards the existence and use of coating liquids in forming semiconductor light absorption layers during the manufacturing of photovoltaic devices. Embodiments of the claimed invention provide a coating liquid for light absorbing semiconducting film formation for high throughput production.

FIG. 1 shows a PV device in accordance with one or more embodiments of the invention. The PV device 100 includes a stack 105 that includes a substrate 102 which may be a glass or stainless steel with an insulating layer. The stack 105 also includes an electrode layer 104, such as Molybdenum (Mo). However, those of ordinary skill in the art will appreciate that embodiments of the electrode layer are not limited to Mo. The PV device 100 also includes a semiconducting light absorption layer 106 deposited via the coating liquid. Embodiments of the coating liquid and deposition of the coating liquid are discussed below. The PV device 100 also includes a transparent conducting layer 108, such as Al:ZnO. The PV device 100 includes a grid electrode 110, such as an Al grid electrode or grid electrodes as known in the art.

Examples of the coating liquid include copper (Cu), zinc (Zn), tin (Sn), sulfur (S), selenium (Se) and/or other dopants known to those in the art. In one or more embodiments of the invention, the coating liquid includes cadmium telluride (CdTe), copper indium gallium selenide (CIGS), cadmium zinc telluride (CZT), copper zinc tin selinium/sulfide (CZTS), and combinations thereof.

Embodiments of the invention also include additives that are included in the coating liquid to facilitate the deposition of coating liquid and the formation of a semiconducting light absorption layer. In one or more embodiments of the invention, the additives are dissolved or dispersed in liquid medium. The liquid medium may consist of a liquid or mixture of liquids. The liquid or mixture of liquids is eliminable after coating by evaporation or decomposition by energy, for example heat or light. In one or more embodiments of the invention, the liquid medium is water. In other embodiments of the invention, the liquid medium is a mixture of water and an organic, for example methanol, ethanol or acetone.

Figure 2:
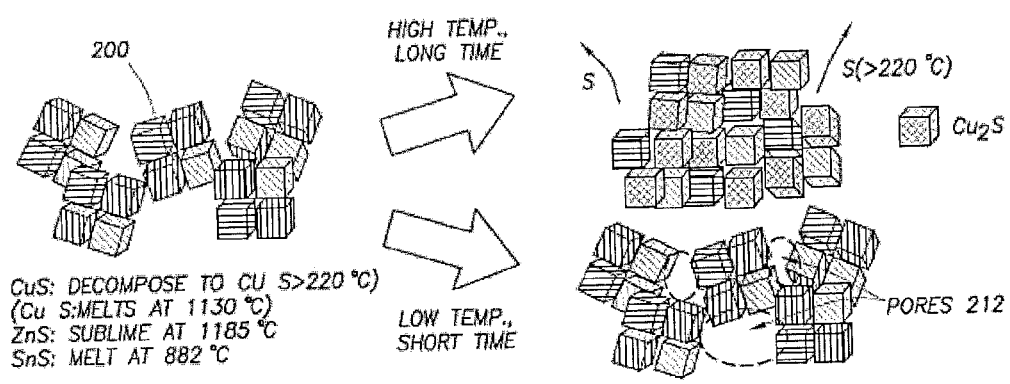
FIG. 2 shows a process for forming a semiconductor light absorption layer in accordance with one or more embodiments of the invention.

FIG. 2 shows a process for forming a semiconductor light absorption layer without the use of additives in accordance with one or more embodiments of the invention. If the particles 200, which may include CuS, ZnS, and SnS particles, are heated at a high temperature for a long time, decomposition of the particles may occur. For example, CuS is known to decompose to $Cu_2S$ at temperatures greater than 220° C. Therefore, heating at a high temperature may result in the formation of $Cu_2S$ accompanied by the release of sulfur. On the other hand, if the particles 200 are heated at a relatively low temperature for a short time, pores 212 may form between the particles, which may result in an overall lower PCE of a PV device.

Figure 3:
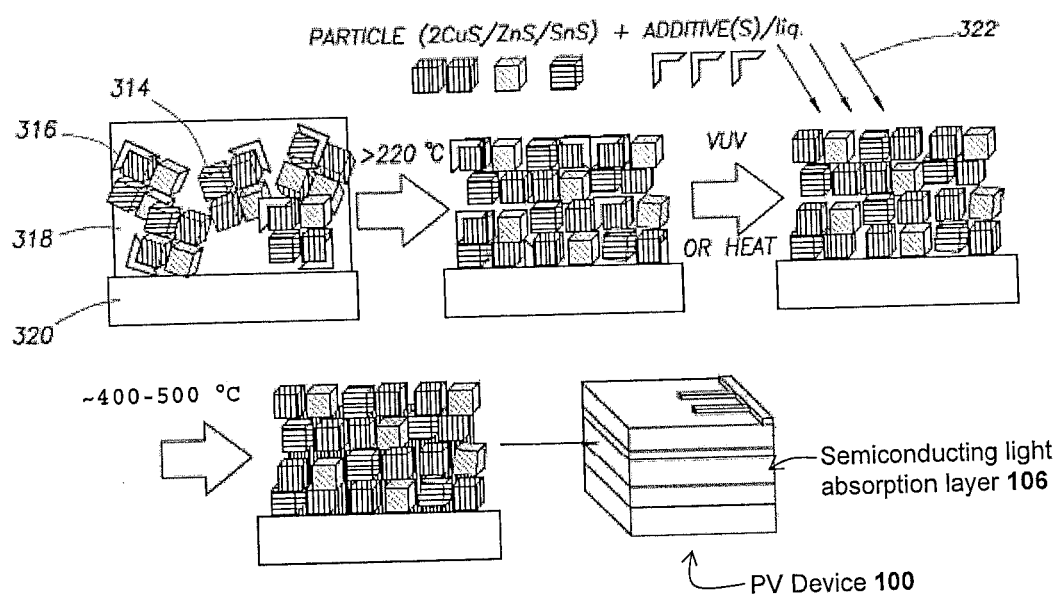
FIGS. 3-5 show processes for the deposition of a coating liquid in accordance with one or more embodiments of the invention.

FIG. 3 shows a process for the deposition of a coating liquid in accordance with one or more embodiments of the invention. In FIG. 3, the particles 314 and additives 316 in a solvent 318 are deposited on the electrode/substrate 320. Then the substrate is heated to a temperature greater than 220° C. to remove excess solvent 318. As a result of the additives 316 the particles will densely pack onto the surface of the substrate. Then, as a result of the heat or the application of UV radiation 322, the additives are decomposed (i.e., eliminated). Also, because of the addition of the additives, the particles 314 may be more stable under the application of the heat as compared to the absence of the additives. Then the particle layer is sintered at a temperature in the range of 400-500° C., resulting in the semiconductor light absorption layer 106 shown in FIG. 1.

In one or more embodiments of the invention, the additives moderately adsorb on CuS, ZnS and/or SnS. As such, the additives may stabilize the surface of compound semiconductor crystal, and facilitate sintering. In one or more embodiments of the invention, the additives are heterocyclic compounds which contain S, N, P and/or Se. In these embodiments, the additives may be a 5 or 6 member heterocyclic compounds. In one or more embodiments, the additives may be molecules that include phosphine. The additives do not enhance the solubility of compound semiconductors in order to pack on to the deposition substrate to obtain a small grain size. After the sintering of the liquid medium, in one or more embodiments, less than 50% of S, N, P or Se may remain in the semiconductor layer. Because organic additives may weaken the necking of particles, in one or more embodiments, a lower sintering temperature may be utilized.

In one or more embodiments, in the liquid solution, the additive facilitates film formation during evaporation. The liquid solution may change to a slurry, and the additives will adsorb on the surface of particles forming the film and retard them into forming coarse grains. Examples of the additives include, but are not limited to 7-hydroxy-5-methyl-1,3,4-triazaindolizine, 5-mercapto-1-phenyl-1H-tetrazole. Examples of nitrogen containing additives include, but are not limited to 1,2,3a,7-tetraazaindene and/or 1,3,3a,7-tetraazaindene such as those disclosed in U.S. Pat. No. 6,190,848. Examples of sulfur containing additives include, but are not limited to those disclosed in U.S. Pat. No. 6,054,260. Examples of phosphor containing additives include, but are not limited to trialkylphosphine or trialkyphosphinoxide.

In one or more embodiments of the invention, the additives may be selected based on the additives' ability to adsorb on the surface of CuS, ZnS and/or SnS. In one or more embodiments, the additive may adsorb strongly to the surface of CuS, ZnS and/or SnS, even under dilute conditions. Also, as the solvent is removed, materials which are not adsorbed on the surface of the CuS, ZnS and/or SnS may form particles that can become a source of black carbon. Therefore, the adsorption isotherm of the additive on the surface of CuS, ZnS and/or SnS may be such that $0<1/n\leq 0.5$, where n is the adsorption coefficient of the additive. In addition, it is noted that the solubility of compounds or ions, such as MS, MSe, $[MS(ligand)]^{n+}$, or $[MSe(ligand)]^{n+}$, may decrease when additives are added. The additives may adsorb to the surface coordinating with Cu, Zn and/or Sn. The additives may include N, S and/or P atoms to help facilitate adsorption.

In one or more embodiments of the invention, the weight ratio of the additive to the particles is less than 0.1.

In one or more embodiments of the invention, the adsorbed additive is stable over 220° C. CuS decomposes at high temperature, >220° C., therefore the inclusion of additives may make the decomposition slower as compared to that without additives. In one or more embodiments of the invention, the additives decompose at higher temperature >400° C.

In one or more embodiments of the invention, the additives are decomposed by energy such as UV radiation, emitted from an excimer lamp (e.g., wavelengths in the range of 172 nm). The additives preferably do not include unnecessary ions like Mg, Ca and so forth in order to minimize the ash and/or residue. However, such elements may be included as dopants to increase the PCE of the PV device coating layer. The additives preferable have a minimal amount of carbon. Carbon is known to form black carbon which may decrease the PCE of the PV device coating layer.

In one or more embodiments, surfactants may be included in the coating liquid. Surfactants may be used provided the surfactants evaporate or decomposed before the sintering process. In one or more embodiments of the invention, the additive may be considered a surfactant.

Figure 4:
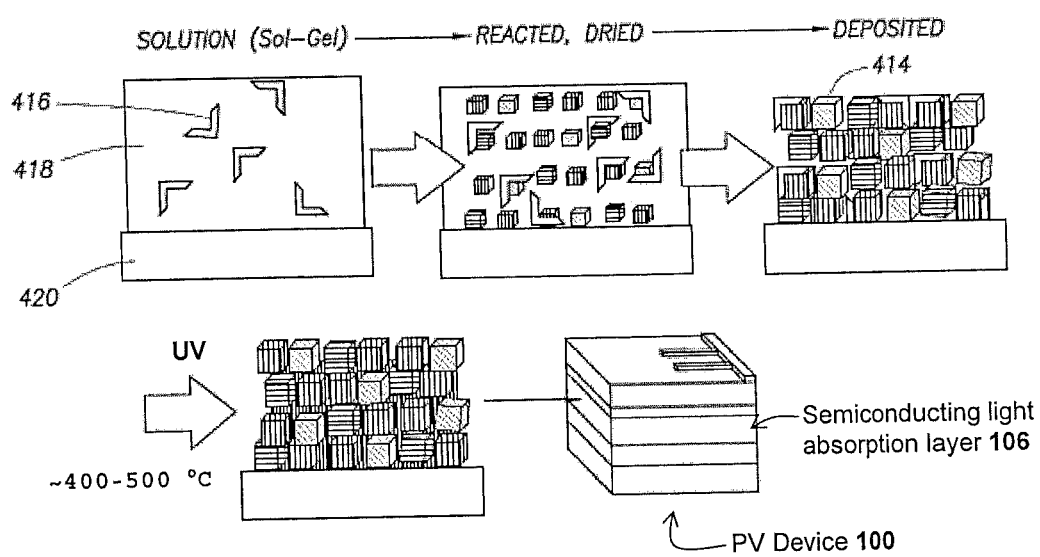

FIG. 4 shows a process for the deposition of a coating liquid in accordance with one or more embodiments of the invention. In FIG. 4, the additives 416 in a solution 418 are deposited on the substrate 420. The particles 414 are then added to react with the additives 416 while on the substrate 420. In one or more embodiments of the invention, the coating liquid may be considered a sol-gel. The substrate 420 is allowed to dry or heated to remove (i.e., evaporate) the solvent 418. The particles 414 are then sintered at approximately 400-500° C., resulting in/forming the semiconducting light absorption layer 106 shown in FIG. 1.

Figure 5:
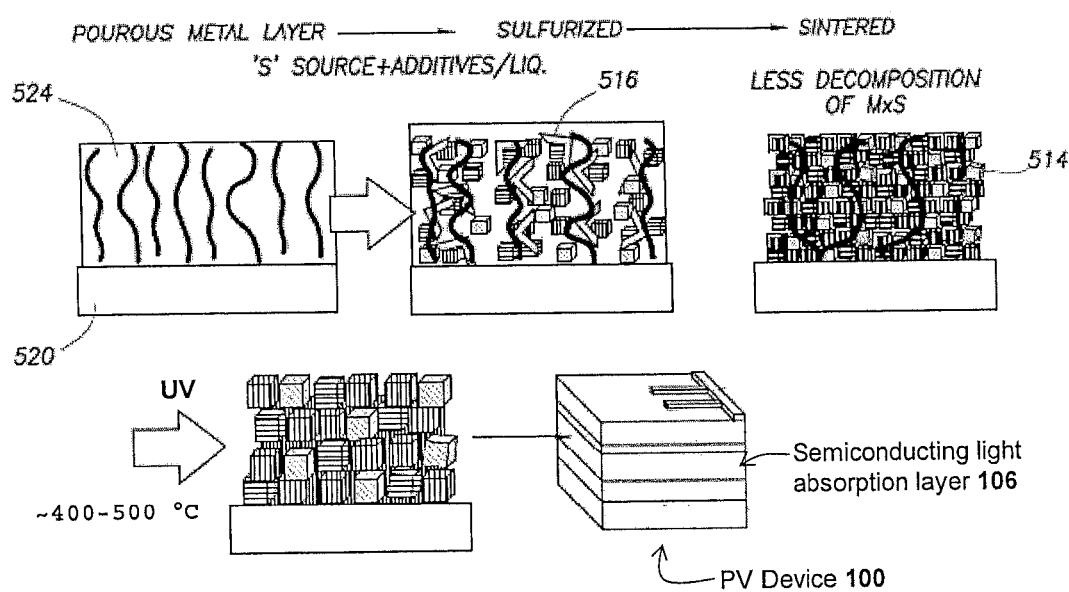

FIG. 5 shows a process for the deposition of a coating liquid in accordance with one or more embodiments of the invention. In FIG. 5, a porous metal layer 524 is deposited onto the substrate 520. The porous metal layer 524 corresponds to the electrode layer, discussed above in reference to FIG. 1. In these embodiments, the coating liquid may include additives and a sulfur source coated onto the porous metal layer 524. The metal layer is porous (i.e., has multiple pores) to facilitate the diffusion of additives into the metal layer. In other words, the additives 516 and particles 514 diffuse into the multiple pores of the porous metal layer 524, followed by drying (as shown in FIG. 4), or heating and/or UV radiation treatment (as shown in FIG. 3). Then the particle layer is sintered at a temperature in the range of 400-500° C., resulting in/forming the semiconducting light absorption layer 106 shown in FIG. 1.

Figure 6:
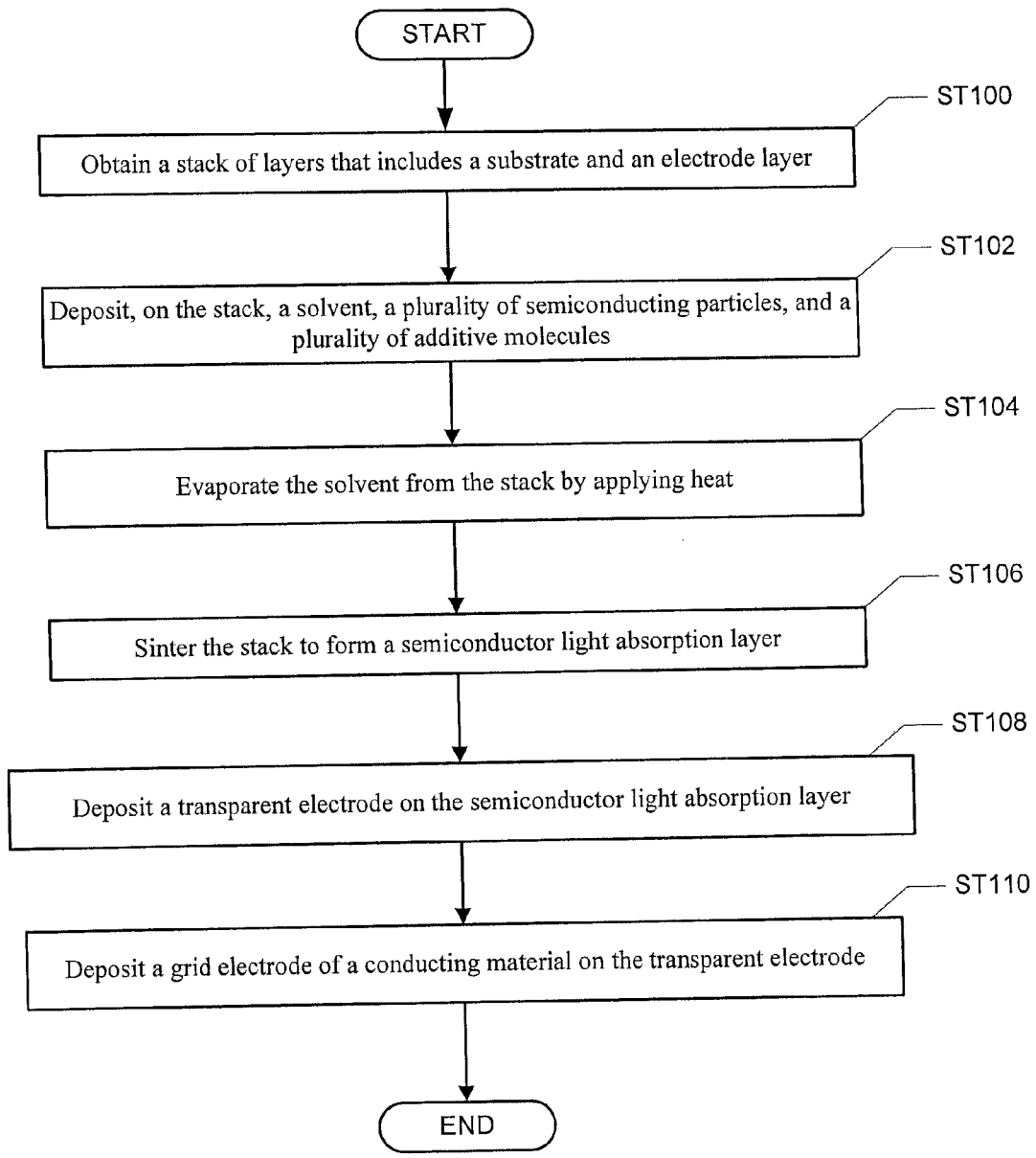
FIG. 6 shows a flowchart in accordance with one or more embodiments of the invention.

FIG. 6 shows a flowchart in accordance with one or more embodiments of the invention. The flowchart shown in FIG. 6 is a process for manufacturing a photovoltaic device having a semiconductor light absorption layer. In ST100, a stack that includes a substrate and an electrode layer is obtained. In one or more embodiments, the substrate is glass or stainless steel (SUS) with an insulating layer on it. In one or more embodiments, the substrate is cleaned and an electrode layer is deposited onto the substrate. The electrode layer may be deposited in several ways, for example sputtering, metallization in liquid. In one or more embodiment of the invention, the electrode material is Molybdenum (Mo).

In ST102, a solvent, a plurality of semiconducting particles, and a plurality of additive molecules are deposited on the stack. In one or more embodiments of the invention, the solvent, plurality of semiconducting particles, and plurality of additive molecules are mixed forming a coating liquid, and it is this coating liquid that is deposited by spin coating or other methods known in the art onto the stack of layers including the substrate and the electrode layer. In other embodiments, the additives may be deposited on the stack after the deposition of the solvent and semiconducting particles. Alternatively, the semiconducting particles may be deposited on the stack after the deposition of the solvent and additives.

In ST104, the solvent is evaporated from the stack by applying heat. The semiconducting light absorption layer is dried by heat and/or baked in an inert gas atmosphere, such as nitrogen. In one or more embodiments of the invention, the inert gas may be a mixture of inert gases and/or some chemical gases, if necessary.

In ST106, the layer is sintered at a temperature in the range of 400-500° C. Sintering usually requires a temperature of more than 400° C., with decomposition beginning at lower temperatures. The presence of the additives may retard decomposition of surface. In addition, in one or more embodiments of the invention, a high energy light such as an excimer light operating in the range of 172 nm may be used together with the heat to decompose the additives just before or during the sintering process. The presence of the UV light may make sintering time shorter. The heat and/or UV light may be applied to eliminate a portion, possibly all, of the additives. In one or more embodiments of the invention, a thin buffer layer, for example CdS may be deposited on the resultant semiconducting light absorption layer.

In ST108, a transparent electrode, such as Al:ZnO or the like is deposited onto the resultant semiconducting light absorption layer. In ST110, a grid electrode of a conducting material, such as Al, is deposited on the transparent electrode. The grid electrode may patterned to facilitate any electric connections to the resultant PV device.

Embodiments of the invention may provide for a coating liquid that utilizes less dangerous materials than those currently used in the art. In addition, embodiments of the claimed invention may provide for a lower temperature process for high throughput manufacturing of PV devices.

While the invention has been described with respect to a limited number of embodiments, those skilled in the art, having benefit of this disclosure, will appreciate that other embodiments can be devised which do not depart from the scope of the invention as disclosed herein. Accordingly, the scope of the invention should be limited only by the attached claims.

What is claimed is:

1. A method of manufacturing a photovoltaic device comprising a semiconductor light absorption layer (SLAL), comprising:
    obtaining a stack of layers comprising a substrate and an electrode layer;
    depositing, on the stack, a solvent, a plurality of semiconducting particles, and a plurality of additive molecules, wherein the plurality of semiconducting particles comprises at least one selected from a group consisting of: cadmium telluride, copper indium gallium selenide, cadmium zinc telluride, and copper zinc tin selinium/sulfide;
    evaporating the solvent from the stack by applying heat;
    sintering the stack to form the SLAL;
    depositing a transparent electrode on the SLAL;
    depositing a grid electrode of a conducting material on the transparent electrode; and
    eliminating, after evaporating the solvent, a portion of the plurality of additive molecules by applying ultraviolet (UV) light.

2. The method of claim 1, wherein the electrode layer is a porous metal layer comprising a plurality of pores, and wherein the solvent, the plurality of semiconducting particles, and the plurality of additive molecules diffuse into the plurality of pores.

3. The method of claim 1, wherein the stack is sintered by heating to at least 400° C.

4. The method of claim 3, wherein the stack is sintered at a temperature in a range of 400–500° C.

5. The method of claim 1, wherein the plurality of additive molecules comprises a phosphine compound.

6. The method of claim 5, wherein the plurality of additive molecules comprises at least one selected from a group consisting of: trialkylphosphine, and trialkyphosphinoxide.

7. The method of claim 1, wherein the plurality of additive molecules are stable at a temperature greater than 400° C.

8. The method of claim 1, wherein the solvent is evaporated by heating to at least 220° C.

9. A method of manufacturing a photovoltaic device comprising a semiconductor light absorption layer (SLAL), comprising:
    obtaining a stack of layers comprising a substrate and an electrode layer;
    depositing, on the stack, a solvent, a plurality of semiconducting particles, and a plurality of additive molecules, wherein the plurality of semiconducting particles comprises at least one selected from a group consisting of: cadmium telluride, copper indium gallium selenide, cadmium zinc telluride, and copper zinc tin selinium/sulfide;
    evaporating the solvent from the stack by applying heat;
    sintering the stack to form the SLAL;
    depositing a transparent electrode on the SLAL; and
    depositing a grid electrode of a conducting material on the transparent electrode, wherein
        the plurality of additive molecules has an adsorption coefficient (n), where $0<1/n\leq0.5$, and
        the weight ratio of the plurality of additive molecules to the plurality of semiconducting particles is less than 0.1.

10. A method of manufacturing a photovoltaic device comprising a semiconductor light absorption layer (SLAL), comprising:
    obtaining a stack of layers comprising a substrate and an electrode layer;
    depositing, on the stack, a solvent, a plurality of semiconducting particles, and a plurality of additive molecules, wherein the plurality of semiconducting particles comprises at least one selected from a group consisting of: cadmium telluride, copper indium gallium selenide, cadmium zinc telluride, and copper zinc tin selinium/sulfide;

evaporating the solvent from the stack by applying heat;
sintering the stack to form the SLAL;
depositing a transparent electrode on the SLAL; and
depositing a grid electrode of a conducting material on the transparent electrode,
wherein the plurality of additive molecules comprises a heterocyclic compound comprising at least one selected from a group consisting of: nitrogen and sulfur,
wherein the plurality of additive molecules comprises at least one selected from a group consisting of: 7-hydroxy-5-methyl-1,3,4-triazaindolizine, 5-mercapto-1-phenyl-1H-tetrazole, 1,2,3a,7-tetraazaindene, and 1,3,3a,7-tetraazaindene.

* * * * *